US011152333B2

(12) United States Patent
Lunde

(10) Patent No.: US 11,152,333 B2
(45) Date of Patent: Oct. 19, 2021

(54) SEMICONDUCTOR DEVICE PACKAGES WITH ENHANCED HEAT MANAGEMENT AND RELATED SYSTEMS

(71) Applicant: Micron Technology, Inc., Boise, ID (US)

(72) Inventor: Aron T. Lunde, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/165,840

(22) Filed: Oct. 19, 2018

(65) Prior Publication Data
US 2020/0126950 A1 Apr. 23, 2020

(51) Int. Cl.
*H01L 25/065* (2006.01)
*H01L 23/498* (2006.01)
*H01L 23/367* (2006.01)
*H01L 23/42* (2006.01)

(52) U.S. Cl.
CPC ........ *H01L 25/0657* (2013.01); *H01L 23/367* (2013.01); *H01L 23/42* (2013.01); *H01L 23/49816* (2013.01); *H01L 23/49822* (2013.01); *H01L 23/49827* (2013.01); *H01L 23/49838* (2013.01); *H01L 2225/06541* (2013.01); *H01L 2225/06572* (2013.01)

(58) Field of Classification Search
CPC ............... H01L 23/367; H01L 23/3675; H01L 23/5384; H01L 2224/023–024; H01L 25/0657; H01L 2924/15151; H01L 23/13; H05K 2201/10378
See application file for complete search history.

(56) References Cited

U.S. PATENT DOCUMENTS

| | | | | |
|---|---|---|---|---|
| 8,294,252 B1* | 10/2012 | Patel | .................... | H01L 23/481 257/686 |
| 8,298,944 B1* | 10/2012 | West | .................... | H01L 23/562 257/621 |
| 9,209,141 B2* | 12/2015 | Lamorey | .............. | H01L 23/642 |
| 9,564,925 B1* | 2/2017 | Bentley | ............ | H03M 13/1555 |
| 10,157,813 B2* | 12/2018 | Hung | .................. | H01L 23/3677 |
| 10,269,678 B1* | 4/2019 | Viswanathan | ........ | H01L 23/047 |
| 10,964,677 B2* | 3/2021 | Ong | ........................ | H01L 23/36 |
| 2009/0322364 A1* | 12/2009 | Mangrum | .......... | G01R 31/2889 324/757.02 |
| 2010/0213600 A1* | 8/2010 | Lau | ..................... | H01L 23/5384 257/693 |
| 2011/0024888 A1* | 2/2011 | Pagaila | ................... | H01L 23/13 257/686 |
| 2011/0204505 A1* | 8/2011 | Pagaila | ................. | H01L 21/568 257/686 |
| 2011/0272814 A1* | 11/2011 | Wachtler | ........... | H01L 23/49816 257/773 |
| 2012/0075807 A1* | 3/2012 | Refai-Ahmed | ..... | H01L 25/0652 361/719 |
| 2012/0161316 A1* | 6/2012 | Gonzalez | ................ | H01L 25/50 257/738 |

(Continued)

*Primary Examiner* — Victoria K. Hall
(74) *Attorney, Agent, or Firm* — TraskBritt

(57) ABSTRACT

A semiconductor device package comprising a carrier substrate having a central well, a logic die facing and operably coupled to TSVs of the carrier substrate, and one or more memory dice in the well and operably coupled to the logic die proximate a surface thereof facing the carrier substrate. An electronic system is also disclosed.

12 Claims, 3 Drawing Sheets

(56) References Cited

U.S. PATENT DOCUMENTS

| | | | |
|---|---|---|---|
| 2012/0175774 A1* | 7/2012 | West | H01L 23/3128 257/751 |
| 2012/0187578 A1* | 7/2012 | Li | H01L 23/13 257/778 |
| 2012/0306085 A1* | 12/2012 | West | H01L 23/481 257/762 |
| 2013/0015578 A1* | 1/2013 | Thacker | H01L 24/13 257/738 |
| 2013/0037802 A1* | 2/2013 | England | H01L 21/568 257/48 |
| 2013/0119528 A1* | 5/2013 | Groothuis | H01L 23/36 257/690 |
| 2013/0277837 A1* | 10/2013 | Teh | H01L 25/50 257/737 |
| 2013/0284572 A1* | 10/2013 | Teh | H01L 25/0657 200/283 |
| 2013/0292818 A1* | 11/2013 | Jo | H01L 24/16 257/737 |
| 2014/0001639 A1* | 1/2014 | Hiraishi | H01L 25/0657 257/773 |
| 2014/0089609 A1* | 3/2014 | Kegel | H01L 23/49827 711/154 |
| 2015/0170991 A1* | 6/2015 | Li | H01L 23/42 |
| 2015/0179607 A1* | 6/2015 | Ho | H01L 21/76251 438/118 |
| 2015/0235990 A1* | 8/2015 | Cheng | H01L 25/50 257/712 |
| 2015/0235993 A1* | 8/2015 | Cheng | H01L 24/14 257/712 |
| 2015/0243609 A1* | 8/2015 | Lamorey | H01L 25/165 361/717 |
| 2015/0364344 A1* | 12/2015 | Yu | H01L 21/56 257/713 |
| 2016/0013173 A1* | 1/2016 | Vadhavkar | H01L 23/3128 438/109 |
| 2016/0155729 A1* | 6/2016 | Fogal | H01L 23/5222 257/713 |
| 2016/0218085 A1* | 7/2016 | Groothuis | H01L 23/3675 |
| 2016/0322340 A1* | 11/2016 | Li | H01L 23/055 |
| 2016/0343639 A1* | 11/2016 | Groothuis | F28D 15/046 |
| 2016/0343687 A1* | 11/2016 | Vadhavkar | H01L 23/3675 |
| 2017/0084514 A1* | 3/2017 | Kumari | H01L 23/473 |
| 2017/0092617 A1* | 3/2017 | Wu | H01L 21/561 |
| 2017/0161420 A1* | 6/2017 | Hou | H01L 25/0657 |
| 2017/0162550 A1* | 6/2017 | Das | H01L 21/486 |
| 2017/0263518 A1* | 9/2017 | Yu | H01L 25/00 |
| 2017/0263588 A1* | 9/2017 | Chen | H01L 25/0657 |
| 2018/0025789 A1* | 1/2018 | Dono | G11C 29/48 714/719 |
| 2018/0053535 A1* | 2/2018 | Son | G11C 5/04 |
| 2018/0082981 A1* | 3/2018 | Gowda | H01L 24/10 |
| 2018/0102311 A1* | 4/2018 | Shih | H01L 24/16 |
| 2018/0130773 A1* | 5/2018 | Bitz | H01L 25/0657 |
| 2018/0233488 A1* | 8/2018 | England | H01L 23/04 |
| 2019/0006318 A1* | 1/2019 | Waidhas | H01L 25/50 |
| 2019/0043831 A1* | 2/2019 | Yoo | H01L 23/5384 |
| 2019/0044764 A1* | 2/2019 | Hollis | H04L 25/4917 |
| 2019/0088634 A1* | 3/2019 | Tsukiyama | H01L 24/20 |
| 2019/0148261 A1* | 5/2019 | Wu | H01L 25/0657 257/684 |
| 2019/0189194 A1* | 6/2019 | Kim | G11C 11/40618 |
| 2019/0229096 A1* | 7/2019 | Vadhavkar | H01L 21/78 |
| 2019/0259695 A1* | 8/2019 | Gandhi | H01L 21/568 |
| 2019/0348401 A1* | 11/2019 | Vadhavkar | H01L 24/94 |
| 2019/0348406 A1* | 11/2019 | Nakano | H01L 25/18 |
| 2019/0355637 A1* | 11/2019 | Chen | H01L 25/0657 |
| 2021/0193581 A1* | 6/2021 | Seo | H01L 23/367 |

* cited by examiner

SEMICONDUCTOR DEVICE PACKAGES WITH ENHANCED HEAT MANAGEMENT AND RELATED SYSTEMS

TECHNICAL FIELD

Embodiments disclosed herein relate to semiconductor device packages. More particularly, embodiments disclosed herein relate to semiconductor device packages configured for enhanced heat management and comprising a relatively high power semiconductor die and one or more associated relatively low power semiconductor dice, and to related systems.

BACKGROUND

It is becoming ever more common in the semiconductor industry to fabricate semiconductor device packages comprising semiconductor dices having different functionalities, such as one or more relatively low power dice stacked on a relatively high power die. For example, multiple memory dice, such as DRAM dice, may be stacked on a logic die configured as a memory controller and the resulting assembly configured as a so-called Hybrid Memory Cube for connection to higher-level packaging. Other assemblies may combine a central processor unit (CPU) die, an application specific integrated circuit (ASIC) die, or a field programmable gate array (FPGA) with multiple memory dice, such as one or more of DRAM, SRAM, FRAM, MRAM, EEPROM, FLASH as well as other types of memory dice. While resulting in a compact package, the memory die stack effectively serves as an insulating blanket to contain heat generated by the higher-power logic die in operation. Disposition of a heat sink over such an assembly in contact with the top of the memory die stack is somewhat ineffective, as the heat sink does not come into direct contact with the high power die, and specifically the portion of the relatively high power die footprint where a substantial portion of heat is generated.

While a number of cooling approaches have been proposed to address the above issue, such approaches have been costly, in some cases complex, and in most cases not widely applicable to a variety of different assemblies of relatively high power semiconductor dice having different functionalities, different integrated circuit configurations and different I/O pin configurations for power, ground/bias and data.

DETAILED DESCRIPTION

Figure 1:
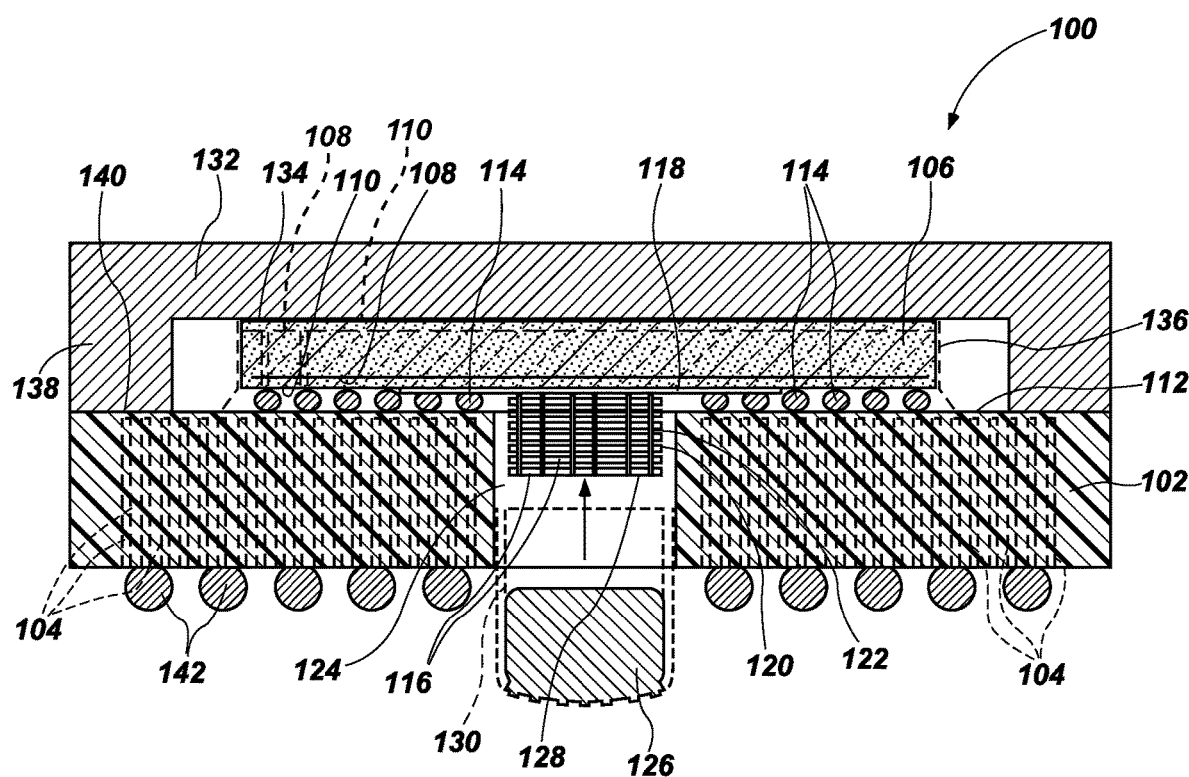
FIG. 1 is a schematic side sectional elevation of a semiconductor device package according to an embodiment of the disclosure.

Semiconductor device packages described herein include an assembly of a relatively high power semiconductor die operably coupled to one or more of relatively low power semiconductor dice, the relatively low power semiconductor dice operably coupled to the relatively high power die and extending into a well in a carrier substrate configured to operably couple the assembly to external circuitry. A heat sink extends over and in thermal contact with the relatively high power die.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for fabricating a semiconductor device package. Only those process acts and structures necessary to understand the embodiments of the disclosure are described in detail below. Additional acts to form a complete semiconductor device package may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly. Further, the relationship designated by any of the foregoing terms does not require, indicate or contemplate actual, direct physical contact of one element with another element unless expressly stated.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, a glass material, a ceramic material, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or opto-electronic materials, such as silicon-germanium, germanium, gallium arsenide, gallium nitride, and indium phosphide. The substrate may be doped or undoped.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "configured" refers to a size, shape, material composition, and arrangement of one or more of at least one structure and at least one apparatus facilitating operation of one or more of the structure and the apparatus in a pre-determined way.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, the term "between" is a spatially relative term used to describe the relative disposition of one material, region, or sub-region relative to at least two other materials, regions, or sub-regions. The term "between" may encompass both a disposition of one material, region, or sub-region directly adjacent to the other materials, regions, or sub-regions and a disposition of one material, region, or sub-region indirectly adjacent to the other materials, regions, or sub-regions.

As used herein, the term "proximate" is a spatially relative term used to describe disposition of one material, region, or sub-region near to another material, region, or sub-region. The term "proximate" includes dispositions of indirectly adjacent to, directly adjacent to, and internal to.

As used herein, the term "neighboring," when referring to a material or region, means and refers to a next, most proximate material or region of an identified composition. Materials or regions of other compositions than the identified composition may be disposed between one material or region and its "neighboring" material or region of the identified composition. For example, a region of passivation material "neighboring" a region of conductive material is the passivation material region, e.g., of a plurality of passivation material regions, that is next most proximate to the particular region of conductive material. The "neighboring" material or region may be directly or indirectly proximate the region or material of the identified composition.

As used herein, the term "redistribution layer" or "RDL" means and includes conductive elements in the form of laterally extending traces, and placed adjacent a surface of an electronic component bearing bond pads or other metallization, which traces enables component-to-component electrical connections at select, laterally offset locations of the two components. A redistribution layer (RDL) may comprise at least one conductive region (e.g., a single layer of conductive traces, or multiple layers interconnected vertically) disposed in an insulative (e.g., dielectric) material and accessible through conductive contacts extending to opposing major surfaces of the RDL from the conductive traces.

As used herein, the term "relatively high power semiconductor die" means and includes, by way of nonlimiting example, logic in the form of a memory controller, a CPU, an ASIC, or a FPGA. Further, a "relatively high power"

semiconductor die means and includes a die having one or more regions of high power density, for example a mobile logic die. As used herein, the term "relatively low power semiconductor die" means and includes, by way of nonlimiting example, memory in the form of DRAM, SRAM, FRAM, MRAM, EEPROM, or FLASH. More broadly, as used herein the terms "relatively high power semiconductor die" and "relatively low power semiconductor die" when used in the context of semiconductor dice in a common assembly or package, are used by way of mutual comparison and not in an absolute sense. In other words, a relatively high power semiconductor die is so characterized in comparison to another, relatively low power associated semiconductor die or dice.

Reference will now be made to the drawings, where like numerals refer to like components throughout. The drawings are not necessarily drawn to scale.

Figure 3:
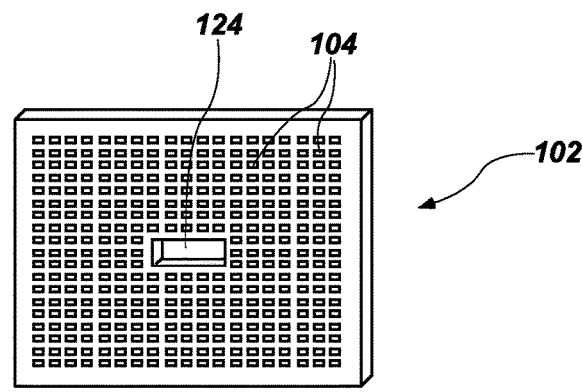
FIG. 3 is a schematic perspective view of an carrier substrate configured for use with embodiments of semiconductor device packages according to embodiments of the disclosure.

FIG. 1 is a schematic side sectional elevation of a semiconductor device package 100 according to an embodiment of the disclosure. Semiconductor device package 100 includes a carrier substrate 102, which may be simply characterized as a "carrier," configured with through substrate vias (TSVs) 104, as shown in broken lines, as well as in FIG. 3. Carrier substrate 102 may comprise a glass epoxy laminate commonly known as an FR-4 or another material, such as a glass material, a ceramic material or a silicon material (e.g., fused silica), exhibiting properties compatible with other components of the package. If carrier substrate 102 is fabricated from a conductive or semiconductive material, conductive material in TSVs 104 may be electrically isolated from the substrate material with a dielectric material lining the via holes, as known to those of ordinary skill in the art.

A relatively high power semiconductor die 106, (e.g., a die having one or more regions of high power density) incorporating integrated circuitry 108 on an active surface 110 thereof is mounted over a surface 112 of carrier substrate 102 and operably coupled to TSVs 104 of carrier substrate 102 through conductive elements 114 protruding from active surface 110, which may comprise solder balls or bumps, conductive studs, columns or pillars, or other conventional conductive elements. In one embodiment, solder bumps are employed, and reflowed to bond to TSVs 104. In another embodiment, copper pillars are employed and diffusion bonded to copper TSVs 104. A dielectric underfill material (not shown) may be disposed between semiconductor die 106 and carrier substrate 102, to mechanically secure semiconductor die 106 and prevent shorting between conductive elements 114. Semiconductor die 106 is also operably coupled to one or more relatively low power semiconductor dice 116 for delivery of power and ground/bias signals. If suitable metallization is present on the active surface 110 of semiconductor die 106, the semiconductor die or dice 116 may be directly operably coupled to semiconductor die 106. Otherwise, the semiconductor die or dice 116 may be operably coupled through conductive traces of a redistribution layer (RDL) 118 on active surface 110, conductive traces of RDL 118 also operably coupling to TSVs 104 of carrier substrate 102 through additional conductive elements 114 protruding from RDL 118. Any suitable number of semiconductor dice 116 may be operably coupled to semiconductor die 106. For example, if semiconductor dice 116 are DRAM dice, one, four, eight, twelve or sixteen dice may be operably coupled, and if multiple semiconductor dice are employed, such dice may be arranged in a stack.

If multiple semiconductor dice 116 are employed, the resulting stack of semiconductor dice 116 is interconnected by TSVs 120 and conductive pillars 122, for example copper pillars, physically and electrically connected to the TSVs 120 through diffusion bonding. A dielectric underfill material (not shown, for clarity) such as a non-conductive film (NCF) or a capillary underfill, may, optionally, be located in spaces between adjacent semiconductor dice 116 to provide additional mutual physical bonding between the semiconductor dice 116 and to surround the conductive pillars 122 and prevent shorting between pillars. The stack of semiconductor dice 116 is, as noted above, either operably coupled directly to semiconductor die 106 or operably coupled to conductive traces of RDL 118 on a major surface thereof opposite semiconductor die 106. By way of example only, it is noted that semiconductor dice 116 may or may not be of the same type. In other words, semiconductor dice 116 may, again by way of example only, comprise DRAM, NAND or NOR Flash memory, 3DXP memory, or minor logic. In such an instance, TSVs 120 of adjacent semiconductor dice 116 may be laterally offset, and mutually coupled by traces extending to locations of TSVs of adjacent semiconductor dice 116, as is known to those of ordinary skill in the art.

The semiconductor die 116 or stack of semiconductor dice 116 extends from RDL 118 into well 124 of carrier substrate 102, facing away from semiconductor die 106. An optional heat sink 126 may be employed in contact at least with a surface 128 of a semiconductor die 116 extending farthest into well 124 through a thermal interface material (TIM, not shown). Heat sink 126 may, optionally comprise a skirt 130, shown in broken lines and which, when heat sink 126 contacts the surface 128 of a semiconductor die 116 extending farthest into well 124 as indicated by the arrow, may laterally partially or completely surround the semiconductor die 116 or stack of semiconductor dice 116 in contact therewith.

Heat sink 132 may extend over semiconductor die 106 in contact with a back side 134 thereof through a TIM (not shown). Heat sink 132 may also be sized, as shown in broken lines, for contact with a lateral periphery 136 of semiconductor die 106 through the TIM, and be configured with an outward and downward flared surface proximate surface 112 of carrier substrate 102 as shown, to accommodate lateral spread of an underfill material, if employed. A peripheral portion 138 of heat sink 132 may contact and be bonded to surface 112 of carrier substrate 102 through a thermally conductive adhesive 140.

TSVs 104 of carrier substrate 102 may operably couple semiconductor device package 100 to higher-level packaging (not shown) through external conductive elements 142, which may comprise solder balls or bumps, conductive pillars, columns or studs, or conductive lands.

Figure 2:
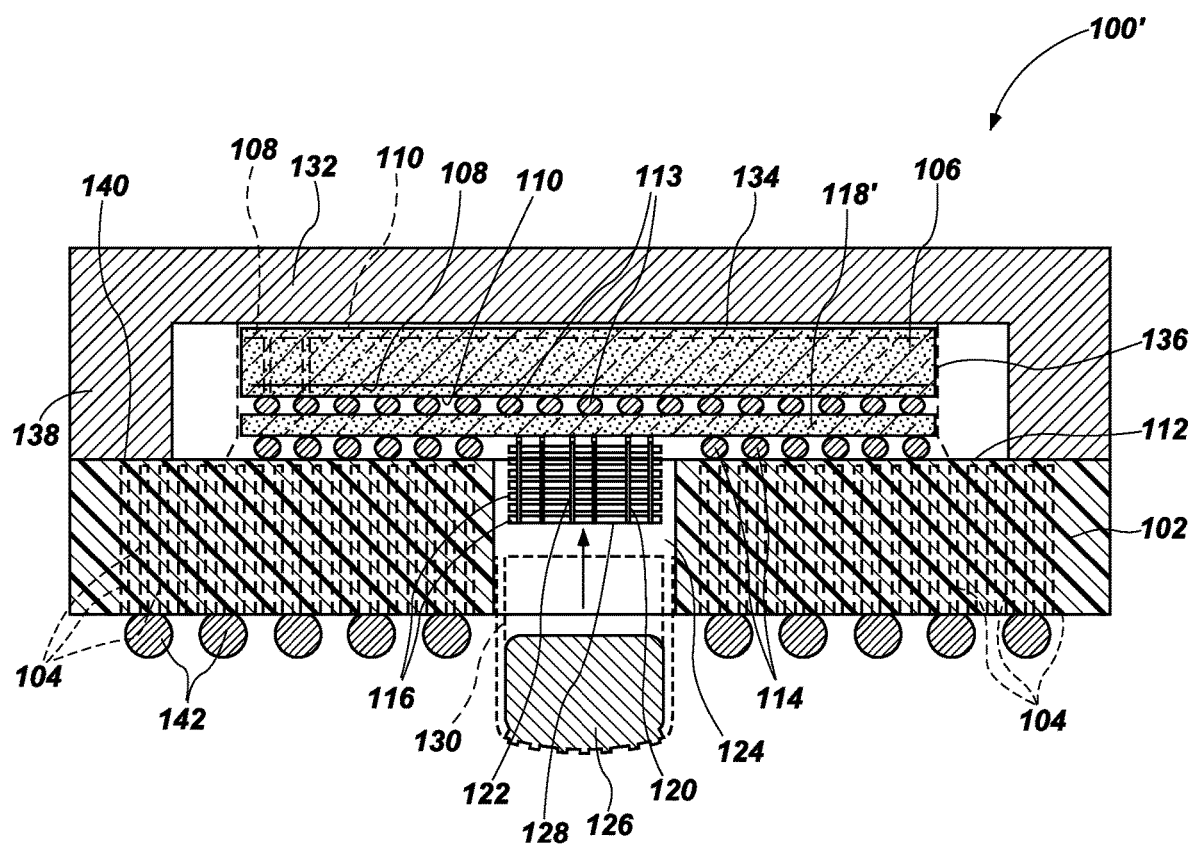
FIG. 2 is a schematic side sectional elevation of a semiconductor device package according to another embodiment of the disclosure.

FIG. 2 is a schematic side sectional elevation of a semiconductor device package 100' according to an embodiment of the disclosure. Semiconductor device package 100' includes a carrier substrate 102, which may be simply characterized as a "carrier," configured with through substrate vias (TSVs) 104, as shown in broken lines, and in FIG. 3. Carrier substrate 102 may comprise a glass epoxy laminate commonly known as an FR-4 or another material, such as a glass material, a ceramic material or a silicon material (e.g., fused silica), exhibiting properties compatible with other components of the package. If carrier substrate 102 is fabricated from a conductive or semiconductive material, conductive material in TSVs 104 may be electrically isolated from the substrate material with a dielectric material lining the via holes, as known to those of ordinary skill in the art.

A relatively high power semiconductor die 106 (e.g., a die having one or more regions of high power density) incorporating integrated circuitry 108 on an active surface 110 thereof is mounted over a surface 112 of carrier substrate 102. Semiconductor die 106 is operably coupled to conductive traces of interposer 118' through conductive elements 113 protruding from active surface 110 and which may comprise solder balls or bumps, conductive studs, columns or pillars, or other conventional conductive elements. In one embodiment, solder bumps are employed, and reflowed to bond to terminals of interposer 118'. In another embodiment, copper pillars are employed and diffusion bonded to terminals of interposer 118'. A dielectric underfill material (not shown) may be disposed between semiconductor die 106 and interposer 118', to mechanically secure semiconductor die 106 and prevent shorting between conductive elements 113.

Interposer 118' is operably coupled to TSVs 104 of carrier substrate 102 through conductive elements 114 protruding from interposer 118' and which, as in the case of conductive elements 113, may comprise solder balls or bumps, conductive studs, columns or pillars, or other conventional conductive elements. A dielectric underfill material may also be disposed between interposer 118' and carrier substrate 102. One or more relatively low power semiconductor dice 116 are operably coupled to terminals of interposer 118' on a side thereof opposite semiconductor die 106. Interposer 118' may facilitate signal routing between components of semiconductor device package 100' as well as providing thermal insulation between semiconductor die 106 and semiconductor dice 116. Any suitable number of semiconductor dice 116 may be operably coupled to semiconductor die 106. For example, if semiconductor dice 116 are DRAM dice, one, four, eight, twelve or sixteen dice may be operably coupled, and if multiple semiconductor dice are employed, such dice may be arranged in a stack.

If multiple semiconductor dice 116 are employed, the resulting stack of semiconductor dice 116 is interconnected by TSVs 120 and conductive pillars 122, for example copper pillars, physically and electrically connected to the TSVs 120 through diffusion bonding. A dielectric underfill material (not shown, for clarity) such as a non-conductive film (NCF) or a capillary underfill may, optionally, be located in spaces between adjacent semiconductor dice 116 to provide additional mutual physical bonding between the semiconductor dice 116 and to surround the conductive pillars 122 and prevent shorting between pillars. By way of example only, it is noted that semiconductor dice 116 may or may not be of the same type. In other words, semiconductor dice 116 may, again by way of example only, comprise DRAM, NAND or NOR Flash memory, 3DXP memory, or minor logic. In such an instance, TSVs 120 of adjacent semiconductor dice 116 may be laterally offset, and mutually coupled by traces extending to locations of TSVs of adjacent semiconductor dice 116, as is known to those of ordinary skill in the art.

The semiconductor die 116 or stack of semiconductor dice 116 extends from interposer 118' into well 124 of carrier substrate 102, facing away from semiconductor die 106. An optional heat sink 126 may be employed in contact at least with a surface 128 of a semiconductor die 116 extending farthest into well 124 through a thermal interface material (TIM, not shown). Heat sink 126 may, optionally comprise a skirt 130, shown in broken lines and which, when heat sink 126 contacts the surface 128 of a semiconductor die 116 extending farthest into well 124 as shown by the arrow, may extend around at least part of a periphery of the semiconductor die 116 or stack of semiconductor dice 116, laterally partially or completely surrounding the stack of semiconductor dice 116 in contact therewith.

Heat sink 132 may extend over semiconductor die 106 in contact with a back side 134 thereof through a TIM (not shown). Heat sink 132 may also be sized, as shown in broken lines, for contact with a lateral periphery 136 of semiconductor die 106 as well as interposer 118' through the TIM and be configured with an outward and downward flared surface proximate surface 112 of carrier substrate 102 as shown, to accommodate lateral spread of an underfill material, if employed between interposer 118' and carrier substrate 102. Of course, if interposer 118' is laterally larger than semiconductor die 106 and an underfill is employed between semiconductor die 106 and interposer 118', heat sink 132 may be configured with an additional flared surface (not shown) between semiconductor die 106 and interposer 118'. A peripheral portion 138 of heat sink 132 may contact and be bonded to surface 112 of carrier substrate 102 through a thermally conductive adhesive 140.

TSVs 104 of carrier substrate 102 may operably couple semiconductor device package 100 to higher-level packaging (not shown) through external conductive elements 142, which may comprise solder balls or bumps, conductive pillars, columns or studs, or conductive lands.

In one specific implementation of the embodiment of FIG. 2, interposer 118' may be configured as a data buffer chip.

In a specific implementation of either embodiment of the disclosure, if relatively high power semiconductor die 106 is TSV-enabled, the active surface 110 may be inverted from the position shown in FIGS. 1 and 2 as shown in broken lines in both FIG. 1 and FIG. 2, so that the integrated circuitry 108 is facing and in direct contact with heat sink 132 through a TIM. Relatively low power semiconductor dice 116 may then be stacked adjacent the (inverted) back side 134 of semiconductor die 106 and operably coupled thereto through either an RDL 118 or an interposer 118', the stack of semiconductor dice 116 again extending into well 124 of carrier substrate 102. Alternatively, semiconductor die 106 may be TSV-enabled with active surface 110 facing the stack of semiconductor dice 116. With such a configuration, it is contemplated that one or more additional semiconductor dice, for example an SRAM or an MRAM die, may be stacked on semiconductor die 106 configured as a memory controller, and be placed in direct thermal communication with heat sink 132. Further, it is contemplated that other combinations of multiple semiconductor dice 106 exhibiting different functionalities may be stacked, for example a CPU over a memory controller.

In each of the above embodiments and by way of specific but nonlimiting example, it is contemplated that the relatively high power semiconductor die 116 may be a logic die configured as a memory controller, and the relatively low power dice may each be a form of DRAM.

As will be appreciated by those of ordinary skill in the art, semiconductor packages according to embodiments of the disclosure may provide superior performance through enhanced thermal management at a lower cost through elimination of TSVs in the logic die, elimination of active cooling requirements, and a lower cost of construction versus Hybrid Memory Cube and other conventional multi-die package configurations. The mutual isolation of heat from a logic die and a memory die stack, in combination with heat sinks drawing heat away from the two sources in opposite directions, as well as insulation between the heat sources provided by an embodiment comprising an interposer, may provide drastically enhanced temperature control for these semiconductor device packages. In addition, such packages may provide a larger market exposure for 3D package solutions. Further, higher package performance may be achieved with lower power in comparison to conventional 3D packages, as signal lengths are reduced to an order of about 40 µm to about 60 µm, reducing driver size (power) and signal distance (latency). For example, an eight die memory stack may exhibit a height of less than about one-half millimeter.

Figure 4:
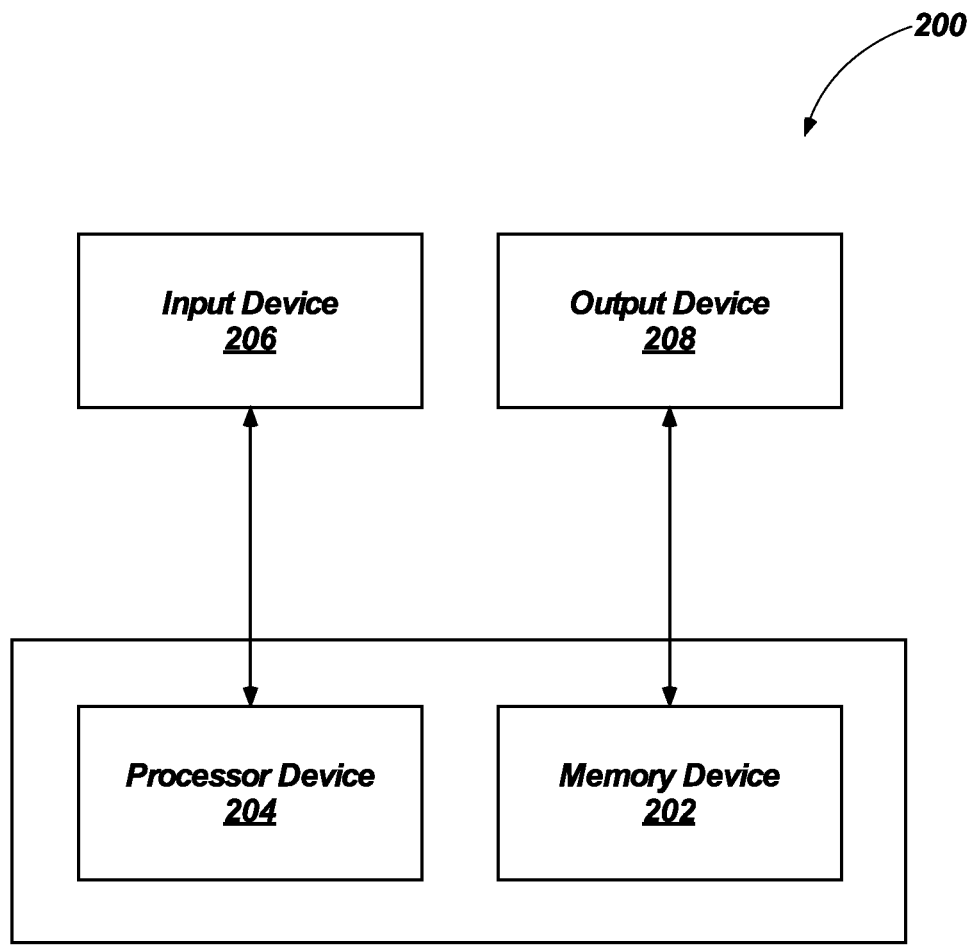
FIG. 4 is a block diagram of an electronic system incorporating a semiconductor device package according to embodiments of the disclosure.

Semiconductor device packages in accordance with embodiments of the disclosure may be used in embodiments of electronic systems of the disclosure. For example, FIG. 4 is a block diagram of an illustrative electronic system 200 according to embodiments of disclosure. The electronic system 200 may comprise, for example, a computer or computer hardware component, a server or other networking hardware component, a cellular telephone (e.g., a "smartphone"), a digital camera, a personal digital assistant (PDA), portable media (e.g., music) player, a Wi-Fi or cellular-enabled tablet such as, for example, an iPAD® or SURFACE® tablet, another wireless device, an electronic book, a navigation device, a display, a chip set, a set top box, a gaming system, a vehicle or component thereof, an illumination system, a sensor, a watch, etc. The electronic system 200 includes at least one memory device 202. The memory device 202 may include, for example, an embodiment of a semiconductor device package 100 or 100'. Such memory device 202 may, as disclosed herein, include memory dice and one or more other semiconductor dice configured for other functions such as, for example, a logic die configured as a memory controller. The electronic system 200 may further include at least one electronic signal processor device 204 (often referred to as a "microprocessor" comprising a CPU, an ASIC or an FPGA), which may be incorporated into semiconductor device package 100 or 100'. In some embodiments, the memory controller and microprocessor may comprise separate, stacked dice in a semiconductor device package 100 or 100'. In other embodiments, the memory controller and microprocessor functions may be incorporated in a single semiconductor die. The electronic system 200 may further include one or more input devices 206 for inputting information into the electronic system 200 by a user, such as, for example, a mouse or other pointing device, a keyboard, a touchpad, a button, or a control panel. The electronic system 200 may further include one or more output devices 208 for outputting information (e.g., radiofrequency, visual or audio output) to a user such as, for example, a modem, a BLUETOOTH® transceiver, a monitor, a display, a printer, an audio output jack, a speaker, etc. In some embodiments, the input device 206 and the output device 208 may comprise a single touchscreen device that can be used both to input information to the electronic system 200 and to output visual information to a user. The input device 206 and the output device 208 may communicate electrically with one or more of the memory device 202 and the electronic signal processor device 204. It is also contemplated that, in lieu of separate memory and signal processor devices 202 and 204, a single assembly of semiconductor dice having different functionalities may be configured as a system in a package including a processor and/or other die functionalities as noted previously.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device package, comprising:
  a carrier including a well in a central region thereof and extending between opposing surfaces thereof to open ends, the carrier comprising TSVs laterally offset from the well;
  a relatively high power semiconductor die comprising a logic die, a central processing unit (CPU) die, an application specific integrated circuit (ASIC) die, or a field programmable gate array (FPGA), extending over one surface of the opposing surfaces of the carrier, over an open end of the well at the surface of the carrier, the relatively high power semiconductor die having a periphery recessed from a periphery of the carrier;
  a heat sink extending over and in thermal contact with the relatively high power semiconductor die, wherein the heat sink extends to the surface of the carrier facing the relatively high power semiconductor die;
  one or more relatively low power semiconductor memory dice located in the well of the carrier; and
  a redistribution layer on a surface of the relatively high power semiconductor die facing the one surface of the opposing surfaces of the carrier, the relatively high power semiconductor die operably coupled to the one or more relatively low power semiconductor memory dice through the redistribution layer, the redistribution layer operably coupled to some TSVs of the carrier by conductive elements extending between the redistribution layer and the some TSVs of the carrier and the relatively high power semiconductor die directly operably coupled to other TSVs of the carrier by additional conductive elements extending between the relatively high power semiconductor die and the other TSVs of the carrier.

2. The semiconductor device package of claim 1, wherein the redistribution layer is located over an active surface of the relatively high power semiconductor die comprising integrated circuitry.

3. The semiconductor device package of claim 1, wherein an active surface of the relatively high power semiconductor die comprising integrated circuitry faces away from the redistribution layer, and TSVs of the relatively high power semiconductor die operably couple the integrated circuitry to the redistribution layer.

4. The semiconductor device package of claim 1, wherein the one or more relatively low power semiconductor memory dice comprises a relatively low power semiconductor memory die facing away from the relatively high power semiconductor die, and further comprising a heat sink located at least partially in the well of the carrier, the heat sink in thermal contact with a surface of the relatively low power semiconductor memory die facing away from the relatively high power semiconductor die.

5. The semiconductor device package of claim 4, wherein the heat sink comprises a skirt extending toward the relatively high power semiconductor die and around at least part of a periphery of the one or more relatively low power semiconductor memory dice.

6. The semiconductor device package of claim 1, wherein the one or more relatively low power semiconductor memory dice comprise a stack of multiple stacked dice, at least some of which comprise TSVs, and the TSVs of the multiple stacked dice and conductive elements between dice of the stack operably couple the stack of multiple dice.

7. The semiconductor device package of claim 1, further comprising conductive elements on a surface of the carrier facing away from the relatively high power semiconductor die and operably coupled to TSVs of the carrier.

8. A semiconductor device package, comprising:
a logic die extending over a surface of a carrier substrate and across an opening of a central well extending from the surface of the carrier substrate through the carrier substrate to another opening, a periphery of the logic die laterally recessed from a periphery of the carrier substrate;
one or more memory dice extending from proximate the surface of the carrier substrate into the central well extending through the carrier substrate;
a redistribution layer carried on a surface of the logic die facing the carrier substrate, extending over the central well and located between the logic die and the carrier substrate, the redistribution layer operably coupling the one or more memory dice to TSVs of the carrier substrate through conductive elements extending between the redistribution layer and the carrier substrate;
the logic die operably coupled directly to the carrier substrate through other conductive elements laterally outward of the conductive elements and extending between the logic die and the carrier substrate; and
a heat sink extending over the logic die on a surface thereof facing away from the carrier substrate, the heat sink in thermal contact with the surface facing away from the carrier substrate, the heat sink comprising a peripheral portion extending about sides of the logic die, about the redistribution layer, and in thermal contact with a surface of the carrier substrate facing the logic die.

9. The semiconductor device package of claim 8, wherein the logic die is configured as a memory controller, and the one or more memory dice comprise multiple, TSV-enabled dice.

10. The semiconductor device package of claim 8, further comprising:
a heat sink located at least partially into the central well and in thermal contact with a surface of a memory die facing away from the logic die.

11. The semiconductor device package of claim 10, wherein the heat sink located at least partially in the central well comprises a skirt extending over at least some sides of the one or more memory dice.

12. The semiconductor device package of claim 8, wherein the logic die is configured as a central processing unit (CPU), an application specific integrated circuit (ASIC)' or a field programmable gate array (FPGA).

* * * * *

UNITED STATES PATENT AND TRADEMARK OFFICE
CERTIFICATE OF CORRECTION

PATENT NO. : 11,152,333 B2
APPLICATION NO. : 16/165840
DATED : October 19, 2021
INVENTOR(S) : Aron T. Lunde Page 1 of 1

It is certified that error appears in the above-identified patent and that said Letters Patent is hereby corrected as shown below:

In the Claims

Claim 12, Column 12, Line 26, change "(ASIC)'" to --(ASIC),--

Signed and Sealed this
Seventh Day of December, 2021

Drew Hirshfeld
*Performing the Functions and Duties of the*
*Under Secretary of Commerce for Intellectual Property and*
*Director of the United States Patent and Trademark Office*